United States Patent [19]

Murai

[11] Patent Number: 5,321,307
[45] Date of Patent: Jun. 14, 1994

[54] HERMETICALLY SEALED METAL STEM OR HEADER FOR SEMICONDUCTOR DEVICE

[75] Inventor: Nobuhiro Murai, Tokyo, Japan

[73] Assignee: NEC Corporation, Japan

[21] Appl. No.: 968,156

[22] Filed: Oct. 29, 1992

[30] Foreign Application Priority Data

Oct. 31, 1991 [JP] Japan ............... 3-285332

[51] Int. Cl.⁵ ............... H01L 23/48; H01L 29/44; H01L 29/52; H01L 29/60
[52] U.S. Cl. ............... 257/774; 257/784; 257/739
[58] Field of Search ............... 257/762, 769, 774, 768, 257/784, 739; 174/50.56, 50.59, 50.61, 50.03, 50.64

[56] References Cited

U.S. PATENT DOCUMENTS 3,436,109  4/1969  Loose ............... 257/698
3,970,235  7/1976  Blust .

Primary Examiner—Sheila V. Clark
Attorney, Agent, or Firm—Laff, Whitesel, Conte, Saret

[57] ABSTRACT

In a stem for a semiconductor device comprising a flat metal plate, a lead and a sealing glass portion, an inner surface of a through-hole made in the flat metal plate is provided with irregularities. Percent defective regarding airtightness on welding for cap sealing and stem fixing is remarkably improved.

4 Claims, 3 Drawing Sheets

HERMETICALLY SEALED METAL STEM OR HEADER FOR SEMICONDUCTOR DEVICE

BACKGROUND OF THE INVENTION

1. Field of the Invention

The present invention relates to a stem, viz. a header for a semiconductor device and in particular to a stem for a semiconductor device on which discrete semiconductor chips or pellets are mounted.

2. Description of the Prior Art

In stems for a semiconductor device in the prior art, as shown in FIGS. 1A, 1B and 1C, a disc-shaped flat metal plate 1 was formed with cylindrical through-holes 2 therein according to a cutting or pressing process and thereafter the plate 1 was subjected to an etching treatment with an acid or the like, for example, at 30°-50° C. for about one minute and an oxidation treatment by being heated in an oxidizing atmosphere, e.g. air. Then, a lead 4 was secured and hermetically sealed to the hole 2 by softening or melting a sealing glass portion 3. After an oxide film formed on the surface of the plate 1 was etched by using HF, plating treatment (e.g. Ni or Au plating) was performed to provide the stem. Accordingly, the inner surface or inner wall of the hole 2 made in the flat metal plate 1, which was in contact with and was adhered to the glass portion 3 as shown in FIG. 1C, remained substantially unchanged during such etching treatment and oxidation treatment, i.e. remained substantially in the same state as that on the forming working. The contact surface was smooth as lower than 10 μm of Rmax.

Accordingly, the length along the contact surface between the inner surface of the hole 2 made in the flat metal plate 1 and the glass portion 3, which extends from the upper surface A of the plate 1 to the lower surface B, is substantially equal to the linear distance between the upper and lower surfaces A and B.

Such a prior art stem for a semiconductor device has a problem that when a chip mounted on the stem is sealed with a cap by an electric resistance welding or the stem is fixed by a laser welding and the like, adhesion of the glass portion 3 to the inner surface of the hole 2 is loosened, resulting in a loss of airtightness. Namely, heat generated on a portion to be welded on welding is conducted to the joint area between the glass portion 3 and the flat metal plate 1, and then the adhesion of the glass portion 3 to the inner surface of the hole 2 is loosened by thermal stresses caused by a difference between the thermal expansion of the glass portion and that of the flat metal plate which are caused by the elevation in temperature.

The length along the joint area between the glass portion and the inner surface of the hole in the prior art is shorter than that in case where the contact surface has substantially irregularities, since the contact surface in the former is smooth or flat. The adhesion between the glass portion and the inner surface of the hole made in the flat metal plate is easily loosened and thus it is hard to obtain a high airtightness.

SUMMARY OF THE INVENTION

It is, therefore, an object of the present invention to provide a stem for a semiconductor device in which a glass portion for securing a lead to a hole made in a flat metal plate is satisfactorily adhered to the hole, and thus, when a chip mounted on the stem is sealed with a cap by an electric resistance welding or the stem is fixed by a laser welding and the like, high airtightness is obtained.

In order to accomplish the above mentioned object, the present invention provides a stem for a semiconductor device comprising a flat metal plate having a through-hole therein; a lead which extends through and is hermetically and insulatively secured to the through-hole and is electrically connected with a semiconductor chip; and a glass portion for securing and sealing the lead, the glass portion being disposed in the through-hole and being in contact with the lead and an inner surface of the through-hole, and the inner surface of the through-hole being provided with irregularities, i.e. ruggedness.

DESCRIPTION OF THE PREFERRED EMBODIMENTS

Figure 1A:
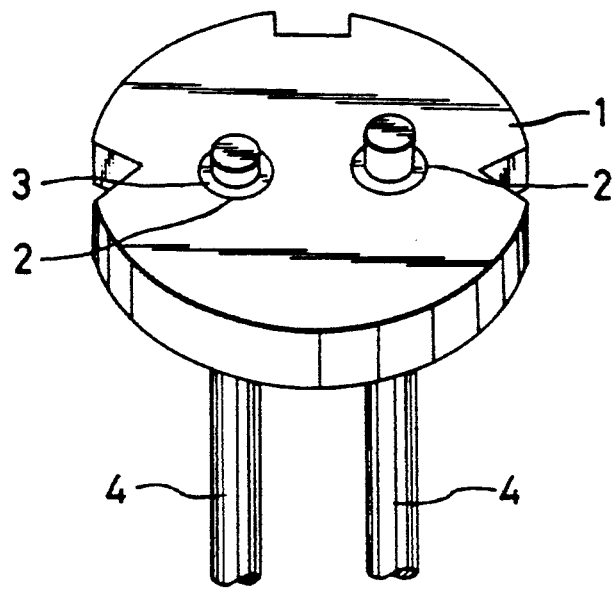
FIG. 1A is a perspective view showing a prior art stem for a semiconductor device.
Figure 1B:
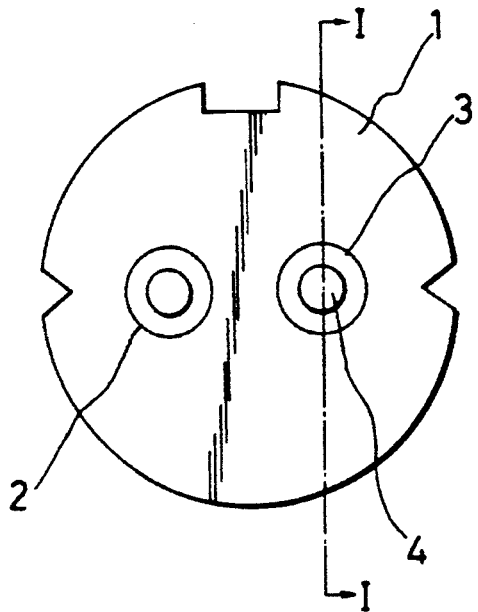
FIG. 1B is a plan view showing the prior art stem of FIG. 1A.

In a stem for a semiconductor device according to the present invention, irregularities or ruggedness of the inner surface or wall of a through-hole or through-holes made in a flat metal plate, which is in contact with a sealing glass portion for securing and sealing a lead to the flat metal plate, may be formed simultaneously with or after the forming working of the flat metal plate. The irregularities of the inner surface of the through-hole are formed such that the inner surface area of the through-hole becomes larger and the glass portion is satisfactorily adhered to the inner surface of the through-hole. The length along such a joint area, i.e. the length of the inner surface of the hole, which extends from the upper surface of the plate to the lower surface, is longer than that of the prior art flat metal plate having a cylindrical through-hole therein which has substantially no irregularities on the inner surface. It is to be appreciated that the glass portion disposed in the hole is in contact with and is adhered to the flat metal plate on only the surface approximately parallel to the lead extending through the hole.

Next, the present invention will be described in more detail with reference to drawings. The same allocated reference numerals in the drawings show the same elements throughout the drawing.

Figure 2A:
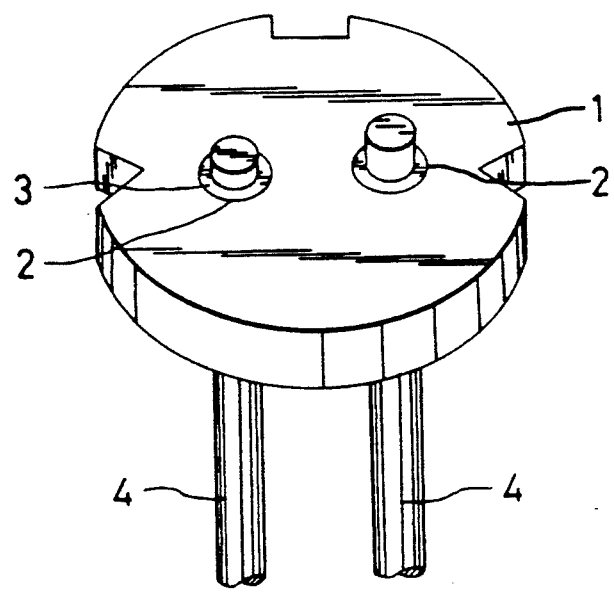
FIG. 2A is a perspective view showing a first embodiment of a stem for a semiconductor device of the present invention.
Figure 2B:
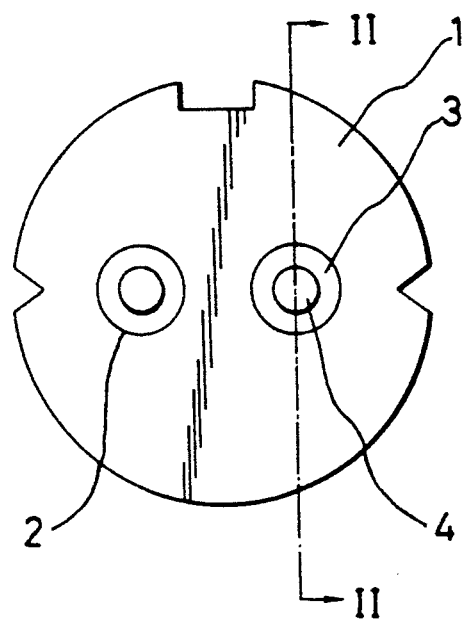
FIG. 2B is a plan view showing the stem of FIG. 2A.
Figure 2C:
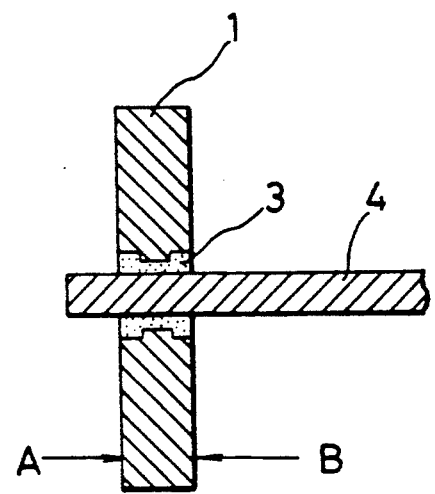
FIG. 2C is a sectional view taken along a line II—II in FIG. 2B.

Referring now to FIGS. 2A, 2B and 2C, there are shown perspective, plan and sectional views of a first embodiment of a stem for a semiconductor device of the present invention, respectively.

A disc-shaped flat metal plate 1 is formed with through-holes 2 having key-shaped sections, respectively, by a pressing process as shown in FIG. 2C, a diameter of the hole 2 on the upper surface A and lower surface B of the plate 1 being larger than that in the intermediate portion therebetween. Thereafter, the plate 1 is subjected to an etching treatment with an acid and an oxidation treatment under heating.

The above hole 2 may be made in the flat metal plate, for example, by performing only a pressing process or by first forming a cylindrical through-hole according to a pressing process and then milling the periphery of the upper and lower portions of the resulting hole to obtain the hole having the key-shaped section as shown in FIG. 2C.

A lead 4 is hermetically and insulatively secured to the hole 2 in flat metal plate 1 via a glass portion 3 to provide the stem.

Figure 1C:
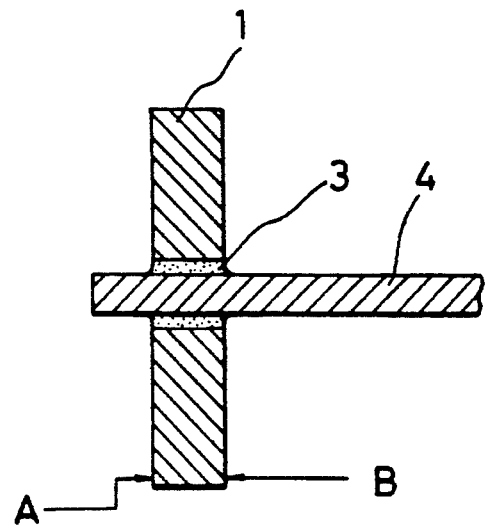
FIG. 1C is a sectional view taken along a line I—I in FIG. 1B.

The glass portion 3 is in contact with the flat metal plate 1 on only the inner surface of the hole 2, and the lead 4 is surrounded by the glass portion 3. The length along the joint area between the glass portion 3 and the inner surface of the hole 2 as mentioned above, which extends from the upper surface A to the lower surface B, is longer than that in case where the prior art hole is of a cylindrical shape having no irregularities as shown in FIG. 1C.

In the stem thus obtained, adhesion of the glass portion to the inner surface of the through-hole is not loosened in the subsequent welding process.

Figure 3A:
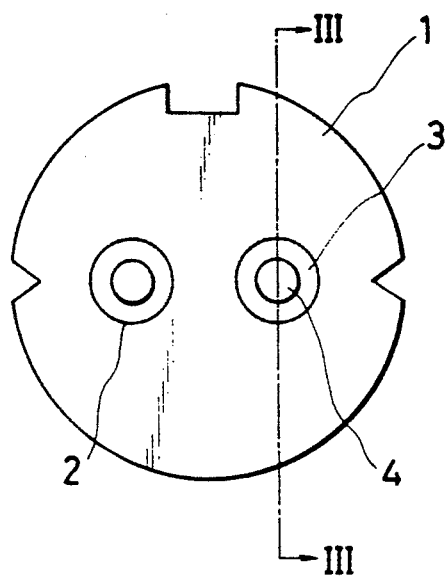
FIG. 3A is a plan view showing a second embodiment of a stem for a semiconductor device of the present invention.
Figure 3B:
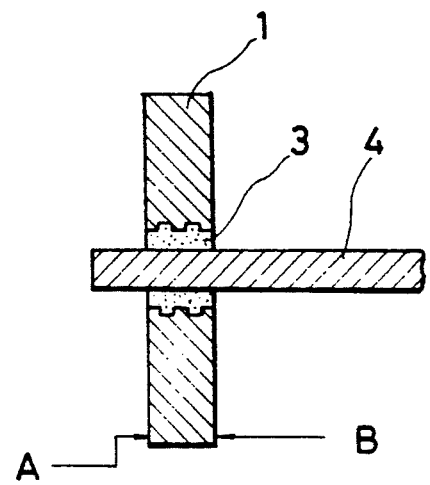
FIG. 3B is a sectional view taken along a line III—III in FIG. 3A.

Referring now to FIGS. 3A and 3B, there are shown plan and sectional views of a second embodiment of a stem for a semiconductor device, respectively. A perspective view of this stem is the same as that of the stem shown in FIG. 2A, and thus it is omitted.

In this embodiment, after a disc-shaped flat metal plate 1 is formed by a cutting or pressing process, through-holes 2 are made in the flat metal plate 1 with a drilling machine, and the plate 1 is subjected to an etching treatment with an acid and an oxidation treatment under heating. Thereafter, a lead 4 is secured to the hole 2 via a glass portion 3 similarly to the first embodiment (FIG. 2C). A spiral cut groove is formed on the inner surface of the hole 2 when the hole 2 is made with a drilling machine. It is to be seen from the section of the hole 2 that concaves and convexes each having a rectangular section are successively formed on the inner surface of the hole 2 as shown in FIG. 3B. The length along the joint area extending from the upper surface A of the plate 1 to the lower surface B is longer than that in case of the prior art cylindrical hole (FIG. 1C).

In the stem thus obtained, adhesion of the glass portion to the inner surface of the through-hole is not loosened in the subsequent welding process.

Figure 4A:
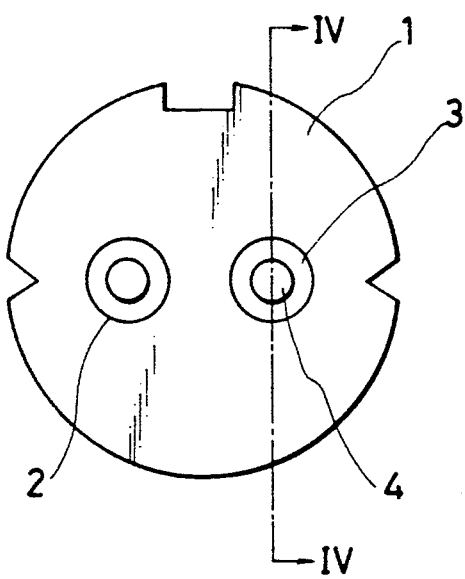
FIG. 4A is a plan view showing a third embodiment of a stem for a semiconductor device of the present invention.
Figure 4B:
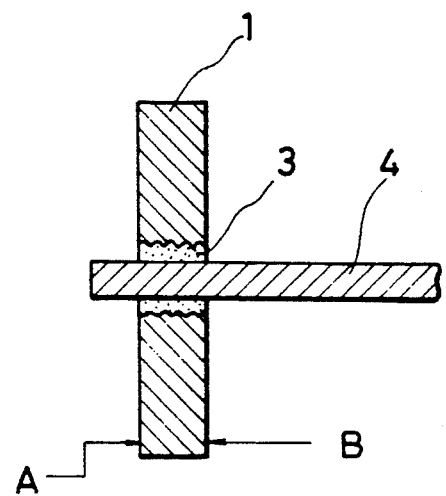
FIG. 4B is a sectional view taken along a line IV—IV in FIG. 4A.

Referring now to FIGS. 4A and 4B, there are shown plan and sectional views of a third embodiment of a stem for a semiconductor device, respectively. A perspective view of this stem is the same as that of the stem shown in FIG. 2A, and thus it is omitted.

In this embodiment, a disc-shaped flat metal plate 1 is formed with through-holes 2 by the cutting or pressing process similar to the prior art. The flat metal plate 1 is then subjected to a strong etching treatment with an acid for a longer period of time, e.g. about 3 to 5 minutes, or at higher temperatures than those in the prior art so that it is formed with larger irregularities on the inner surface of the hole 2. Thereafter, the plate 1 is subjected to an oxidation treatment under heating. According to this embodiment, the surface roughness Rmax is 10 μm and higher. The length along the joint area between the inner surface of the hole 2 and a glass portion 3, which extends from the upper surface A of the plate 1 to the lower surface B, is longer than that in the case that the plate is subjected to the prior art etching treatment (FIG. 1C).

Table 1 shows the percent defective regarding airtightness when the stems which are fabricated according to the prior art and the third embodiment and are provided with the through-holes having different surface roughnesses are welded to caps by an electrical resistance welding method. The etching treatment in the prior art is performed at 30° to 50° C. for one minute. It is seen from the table that airtightness defective percent in case where the joint area is smooth as in the prior art is 5%, while the airtightness defective percent is lowered as the surface roughness of the joint area increases so that irregularities become larger, resulting in a remarkable improvement in percent defective.

TABLE 1

| Stem Fabricating Method | Prior Art | Third Embodiment | |
|---|---|---|---|
| Surface Roughness (Rmax) | 5 μm | 11 μm | 17 μm |
| Airtightness Defective Percent (%) | 5.0 | 0.5 | 0.1 |

As mentioned above, in accordance with the present invention, since the length along the inner surface or wall of the hole made in the flat metal plate, which extends from one plane to the opposite plane of the flat metal plate, is made longer than that in the prior art by providing the inner surface of the hole with irregularities, i.e. ruggedness, the glass portion is satisfactorily adhered to the inner surface of the through-hole so that higher airtightness can be readily obtained.

While the present invention has been particularly described with reference to the preferred embodiments thereof, it will be understood by those skilled in the art that the foregoing and other changes in form and details may be made therein without departing from the spirit and scope of the invention.

What is claimed is:

1. A stem for a semiconductor device, comprising a flat metal plate having a through-hole therein; a lead extending through and being hermetically and insulatively secured to the through-hole and being electrically connected with a semiconductor chip; and a glass portion for sealingly surrounding said lead, said glass portion being disposed in the through-hole in contact with both said lead and an oxide film formed on an inner surface of said through-hole, said inner surface of the through-hole and hence the oxide film being provided with irregularities and said glass portion having an outer surface associating with the irregularities.

2. The stem for a semiconductor device as defined in claim 1 which said irregularities are concaves and convexes each having a rectangular section.

3. The stem for a semiconductor device as defined in claim 1 in which said irregularities are in a shape of a spiral groove.

4. The stem for a semiconductor device as defined in claim 1 in which said inner surface of the through-hole has a surface roughness Rmax of 10 μm and higher.

* * * * *